US010124602B2

(12) United States Patent
Essien

(10) Patent No.: US 10,124,602 B2
(45) Date of Patent: Nov. 13, 2018

(54) APPARATUSES AND METHODS FOR STABLE AEROSOL DEPOSITION USING AN AERODYNAMIC LENS SYSTEM

(71) Applicant: Marcelino Essien, Cedar Crest, NM (US)

(72) Inventor: Marcelino Essien, Cedar Crest, NM (US)

(73) Assignee: Integrated Deposition Solutions, Inc., Albuquerque, NM (US)

( * ) Notice: Subject to any disclaimer, the term of this patent is extended or adjusted under 35 U.S.C. 154(b) by 209 days.

(21) Appl. No.: 14/927,380

(22) Filed: Oct. 29, 2015

(65) Prior Publication Data

US 2016/0193627 A1 Jul. 7, 2016

Related U.S. Application Data

(60) Provisional application No. 62/073,060, filed on Oct. 31, 2014.

(51) Int. Cl.
*C23C 16/00* (2006.01)
*B41J 3/407* (2006.01)

(52) U.S. Cl.
CPC .................................... *B41J 3/407* (2013.01)

(58) Field of Classification Search
CPC ........................................................ B41J 3/407
See application file for complete search history.

(56) References Cited

U.S. PATENT DOCUMENTS

2003/0228124 A1* 12/2003 Renn ........................ B05D 1/02 385/147
2007/0181060 A1* 8/2007 Renn ....................... C23C 24/04 118/300

* cited by examiner

*Primary Examiner* — Kelly M Gambetta

(57) ABSTRACT

The object of the invention is the provision of apparatuses and methods for maskless direct printing of continuous films or discreet structures on a substrate using aerodynamic focusing. The method uses an interchangeable and variable aerodynamic lens system and an annularly flowing sheath gas to produce a highly collimated micrometer-size stream of aerosolized droplets. The lens system is comprised of a multi-orifice lens or a single-orifice lens or lenses coupled to a converging fluid dispense nozzle. A combined annular sheath and aerosol flow is propagated through at least two orifices. A liquid atomizer with temperature control, variable continuous or pulsed excitation, and constant or variable frequency, is used to produce an aerosol size distribution that overlaps the functional range of the aerodynamic lens system. The combined flow through the lens system produces a narrow, highly stable subsonic jet that remains collimated for as much as one centimeter beyond the orifice of the nozzle. The method produces well-defined traces on a substrate with line widths in a range from approximately 10 to 1000 microns.

5 Claims, 10 Drawing Sheets

Figure 1:
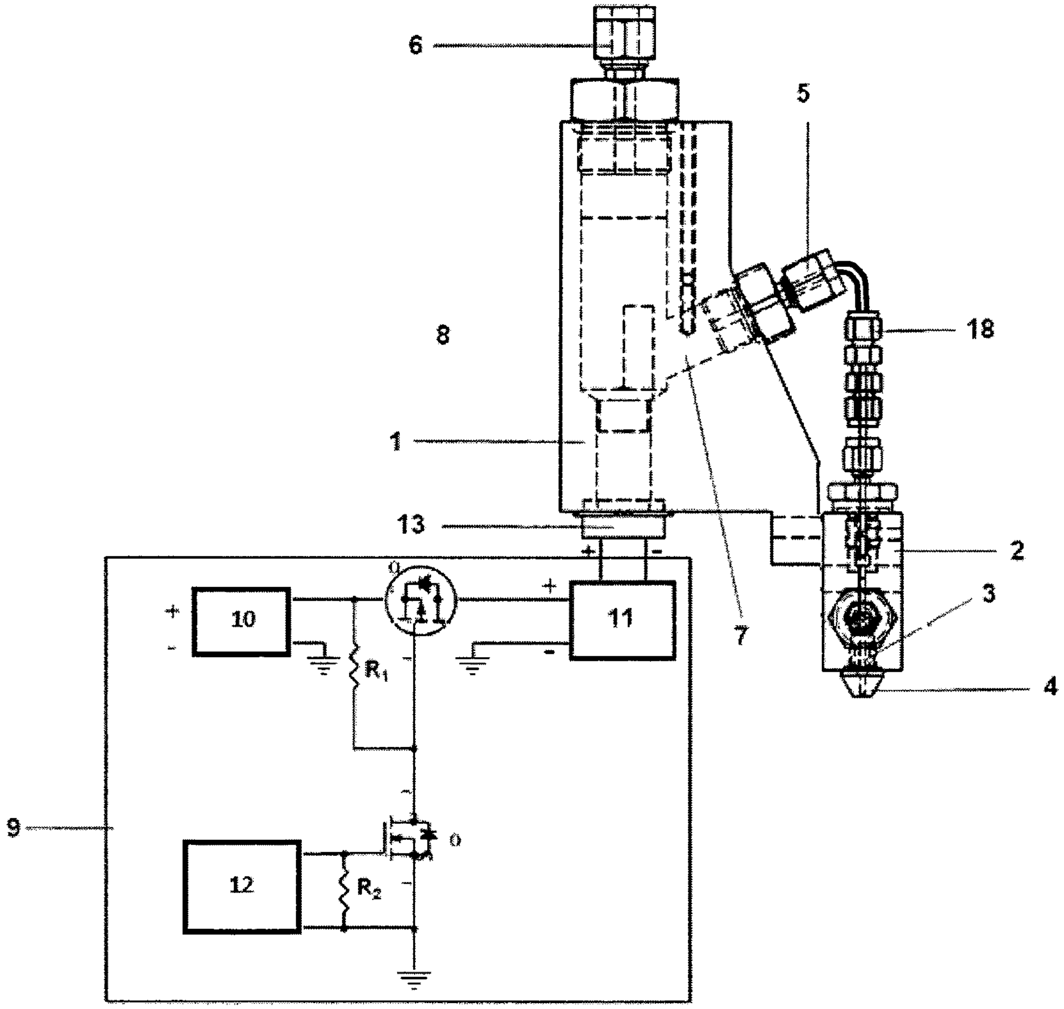

APPARATUSES AND METHODS FOR STABLE AEROSOL DEPOSITION USING AN AERODYNAMIC LENS SYSTEM

RELATED U.S. APPLICATION DATA

Provisional patent application 62/073,060, filed Oct. 31, 2014

REFERENCES CITED

U.S. Patents

| | | |
|---|---|---|
| 4,019,188 | April 1977 | Hochberg, et al. |
| 6,348,687 | February 2002 | Brockmann, et al. |
| 6,924,004 | August 2005 | Rao, et al. |
| 7,108,894 | September 2006 | Renn |
| 7,652,247 | January 2010 | Lee, et al. |
| 8,119,977 | February 2012 | Lee, et al. |
| 8,561,486 | October 2013 | Novosselov, et al. |

OTHER PUBLICATIONS

De la Mora. (1988). Aerodynamic Focusing of Particles in a Carrier Gas. *J. Fluid Mech.,* 195, 1-21.

Cheng and Dahneke. (1979). Properties of Continuum Source Particle Beams. II. Beams Generated in Capillary Expansions. *J. Aerosol Sci.,* 10, 363-368.

Dahneke. (1977). Nozzle-Inlet Design For Aerosol Beam Instruments. In J. J. Potter, *Rarefied Gas Dynamics, Vol. II* (pp. 1163-1172). New York: AIAA.

Dahneke. (1978). Aerosol Beams. In D. T. Shaw, *Recent Developments in Aerosol Science* (pp. 187-223). New York: John Wiley & Sons.

Dahneke. (1979). Properties of Continuum Source Particle Beams. I. Calculation Methods and Results. *J. Aerosol Sci.,* 10, 257-274.

Deng, R. (2008). Focusing Particles with Diameters of 1 to 10 Microns into Beams at Atmospheric Pressure. *Aerosol Science and Technology,* 42:11, 899-915.

Mallina. (1999). High-Speed Particle Beam Generation: Simple Focusing Mechanisms. *J. Aerosol Sci.,* 30, 719-738.

Mallina. (2000). High Speed Particle Beam Generation: a Dynamic Focusing Mechanism for Selecting Ultrafine Particles. *Aerosol Sci. Technol.,* 33, 87-104.

FIELD OF THE INVENTION

Embodiments of the invention generally relate to aerosol jetting devices, particularly devices for direct printing of features on a substrate.

BACKGROUND OF THE INVENTION

General Discussion of Aerodynamic Focusing

Aerodynamic Focusing using an Aerodynamic Lens

The use of aerodynamic lenses to focus an aerosol stream was first reported by Lui. An aerodynamic lens can be defined as a flow configuration in which a stream traveling through a cylindrical channel with diameter D is passed through an orifice with diameter d, undergoing one contraction upstream of the orifice and one subsequent and immediate expansion downstream of the orifice. A contraction of an aerosol stream is produced as the flow approaches and passes through the orifice. The gas then undergoes an expansion as the flow propagates downstream into a wider cross sectional area. Flow through the orifice forces particles towards the flow axis, so that the aerosol stream is narrowed and collimated. Aerosol streams collimated by an aerodynamic lens system have been designed for use in many fields, including pharmaceutical aerosol delivery and additive manufacturing. In the typical aerodynamic lens system, an aerosol stream is tightly confined around the axis of a flow cell by passing the particle distribution through a series of axisymmetric contractions and expansions. Each section of the lens system consisting of a flow channel and an orifice is defined as a stage. Lui has presented a method and apparatus for focusing sub-micron particles using an aerodynamic lens system. Di Fonzo et. al. and Dong et. al. have designed lens systems that focused particles with diameters in the range from 10 to 100 nanometers and 10 to 200 nanometers, respectively. Wang has designed a lens system to focus particles in the range of 3 to 30 nanometers. Lee has reported a method of focusing micron-sized particles at atmospheric pressures using a single lens system composed of multiple stages.

In U.S. Pat. No. 6,348,687, Brockmann discloses an apparatus for generating a collimated aerosol beam of particles with diameters from 1 to 100 microns. The aerodynamic lens system of Brockmann uses a series of fixed lens and an annular sheath gas surrounding a particle-laden carrier gas. The system of Brockmann was used to focus 15 micron aluminum particles to a diameter of 800 microns, and generally uses the same aerosol and sheath gas flow rates. Lee (U.S. Pat. No. 7,652,247) discloses an aerodynamic lens system for focusing nanoparticles in air with diameters between 5 and 50 nanometers. In U.S. Pat. No. 8,119,977, Lee discloses a multi-stage, multi-orifice aerodynamic lens for focusing a range of particle diameters covering two orders of magnitude, from 30 to 3000 nanometers. In U.S. Pat. No. 6,924,004, Rao discloses a method and apparatus for depositing films and coatings from a nanoparticle stream focused using an aerodynamic lens system. The apparatus of Rao uses high-speed impaction to deposit nanoparticles on a substrate. A method of separating particles from a gas flow using successive expansions and compressions of the flow created by an aerodynamic lens is discussed by Novosselov in U.S. Pat. No. 8,561,486.

The preferred embodiment of the invention is shown in FIG. 1. The apparatus consists of an ultrasonic atomizer (1), a pulsed power source (9), a flow cell (2), and an aerodynamic lens assembly (3), and (4). The pulsed power source produces a constant aerosol density in the atomizer, applying a voltage pulse to the transducer (13) at intervals ranging from approximately 0.5 to 2 seconds. The aerodynamic lens assembly focuses the distribution of aerosol droplets at a point approximately three to ten millimeters downstream of the second lens (4), enabling accurate printing of various inks, including nanoparticle suspensions, precursor solutions, and polymer is solutions.

Figure 2:
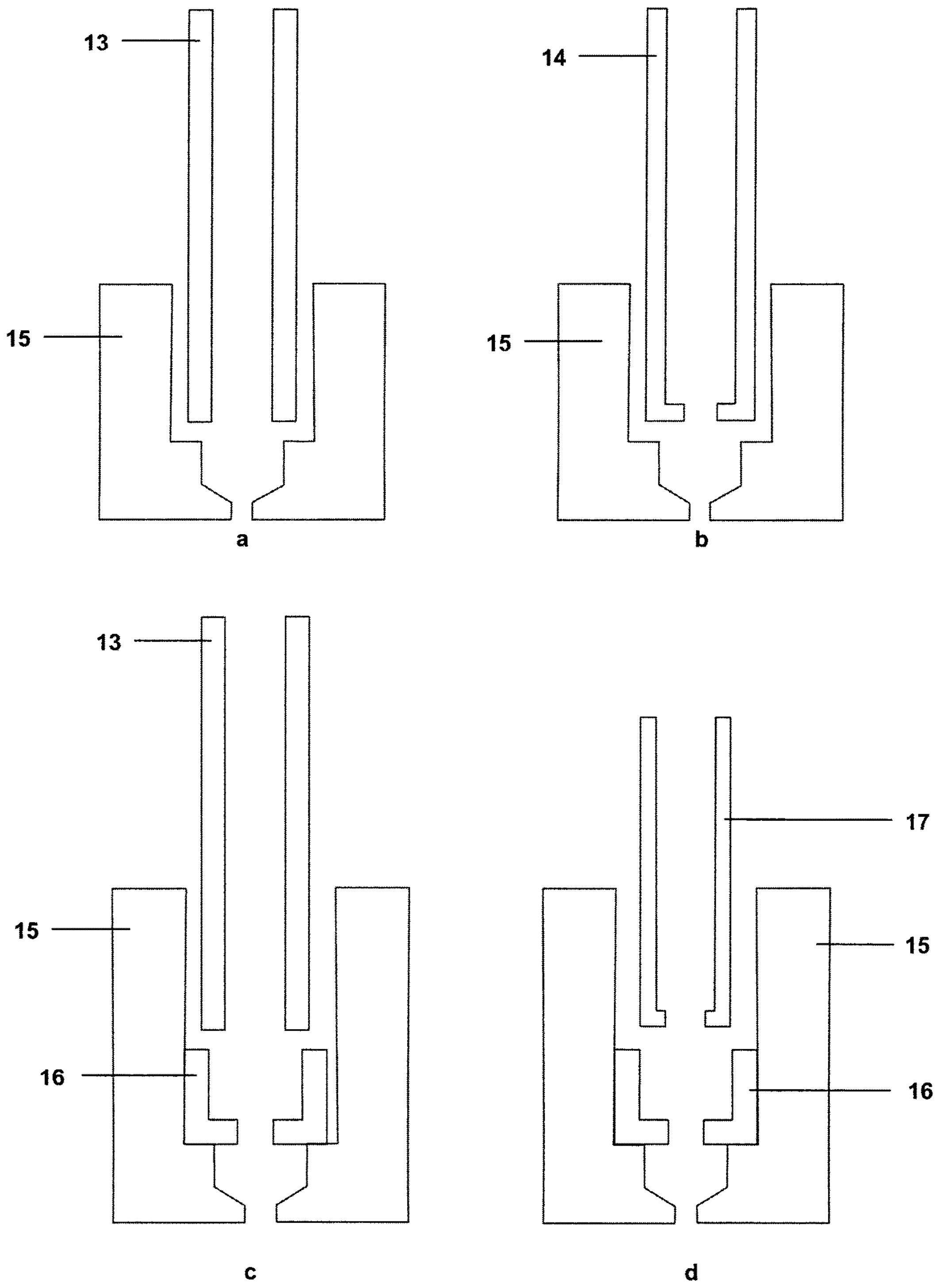

Cross sectional representations of various aerodynamic configurations are shown in FIG. 2. In general, each configuration consists of an orifice or series of orifices connected to a converging exit nozzle with a sheathed gas flow. FIG. 2*a* shows a configuration wherein an aerosol stream emerges from a capillary 13 and flows into a sheathed exit nozzle 15. FIG. 2*b* shows an aerosol stream that is first collimated by an aerodynamic lens 14 before passing through a sheathed exit nozzle 15. In FIG. 2*c* an aerosol stream emerges from a capillary 13 and enters a sheathed aerodynamic lens 16 mounted inside an interchangeable exit nozzle 15. FIG. **2*d* shows a system of two aerodynamic lenses in communication with a converging exit nozzle. The aerosol stream of FIG. 2*d* is sheathed after passing from the first lens 17, and during passage through the second lens 16. The configurations of FIGS. 2*c* through 2*d*** are used in the present invention. In each configuration, the converging exit nozzle may be replaced by an orifice with a non-converging flow cross section.

Aerodynamic Focusing using a Single-Orifice

Numerous studies have been performed to characterize the focusing effect created by propagating an aerosol stream through a single orifice consisting of a capillary tube, a converging nozzle, or a sheathed nozzle. (Dahneke, 1977), (Dahneke, 1978), (Cheng and Dahneke, 1979), (Dahneke, 1979), (Mallina, 1999), (Mallina, 2000). These theoretical and experimental studies conclude that single-orifice systems can only focus a narrow range of particle sizes to a sharp point (Deng, 2008). Specifically, single-orifice systems can focus a mono-dispersed aerosol distribution to a well-defined point, but poly-dispersed distributions will be focused at different positions along the flow axis, with the focus position and focused diameter dependent on the droplet size. A mathematical description of focusing of an aerosol stream passing through an orifice has been developed in terms of a critical Stokes number S*. (De la Mora, 1988). Particles with Stokes number above S* cross the flow axis at some finite distance from the lens, while sub-critical particles do not cross the axis, and critical particles cross the axis at infinity.

In U.S. Pat. No. 4,019,188, Hochberg discloses an apparatus for producing a narrow, collimated stream of aerosol particles using a carrier gas jet and a surrounding sheath flow. The Hochberg apparatus uses a carrier gas velocity that forces particles to the center of the gas flow, surrounds the flow with a sheath gas, and directs the combined flow through a nozzle.

Aerodynamic Focusing for Direct Printing Applications

In a Direct Printing technique, a liquid is deposited onto a substrate without the use of masks or lithographic techniques. The present invention uses an aerodynamic lens system to form a thin aerosol jet surrounded by a sheath gas. The diameter of the core aerosol distribution is a function of the lens parameters such as channel length, lens orifice diameter, and the length of the lens.

The present invention discloses a method for stable, maskless direct printing on a substrate using aerodynamic focusing to produce highly collimated beams of sub-micron and micron-size droplets using an aerodynamic lens system and an annular sheath flow closely matched to the output of an aerosol source. In the preferred embodiment of the invention, the aerosol source is a low-power ultrasonic atomizer operating in a continuous or pulsed mode. The atomizer described herein produces a relatively narrow range of droplet diameters, from approximately 0.5 to 5 microns, facilitating the production of a narrow, collimated aerosol beam. The atomizer power is typically less than approximately 10 watts. The lens system may consist of a single stage or multiple stages. The present invention is used to deposit well-defined traces onto various substrates with sub-micron edge definition. The apparatus uses interchangeable and variable aerodynamic lens assemblies with configurations that can be tuned to match the aerosol output of the aerosol generator, so that a high degree of collimation of the aerosol beam is obtained. Tuning the atomizer/aerodynamic lens assembly is achieved by varying the lens diameters or by varying the distance between the lenses.

Atomization and Aerodynamic Lens Selection

The atomization method and the resulting droplet distribution are of critical importance in aerosol-based deposition processes. Aerosol droplet diameters that are useful for direct write applications are generally in the range of approximately 1 to 5 microns. However production of mono-dispersed aerosols in the range of 1 to 5 microns can be prone to clogging and unstable droplet generation. Consequently, aerosol generators with a relatively wide droplet distribution are commonly used in many aerosol-based applications. If a poly-dispersed aerosol droplet distribution is used however, poor deposition quality may be obtained unless the deposition system provides a mechanism for collimation or focusing of a range of droplet sizes. It is the object of the present invention to provide apparatuses and methods for deposition of fine traces on various substrates using a closely-matched atomizer/aerodynamic lens assembly.

Mono-Dispersed Aerosol Generation

Several mono-dispersed aerosol generators are commercially available. Chen provides a list of commercially available mono-dispersed aerosol generators, with information on droplet size, liquid type, carrier gas, and application. One method of producing a mono-dispersed aerosol distribution is by controlling the breakup of a liquid jet propagated from an orifice. Controlled droplet breakup of a liquid jet is used to produce mono-dispersed droplets in the range from 1 to 1000 microns. Similarly mono-dispersed aerosols have been produced by applying a pressure pulse to a liquid volume in direct communication with an orifice. While mono-dispersed aerosol generation devices are commercially available, the application of such devices is largely found in research settings and is not widely found in production environments. An object of the present invention is therefore the provision of a direct write apparatus and method using a poly-dispersed aerosol source.

Poly-Dispersed Aerosol Generation

A common method of producing an aerosol of liquid droplets is to use piezoelectric excitation of a bulk liquid in contact with an ultrasonic transducer. The liquid may be placed in direct contact with the transducer, or the liquid may be held in a secondary container, with the ultrasonic energy transmitted to the liquid through a thin membrane. Direct contact methods generally require less power for atomization, since no transmission losses occur between the transducer and membrane. In ultrasonic atomization a fluid spout accompanies the production of aerosol, and may extend several centimeters above the surface of the transducer. Furthermore, studies have shown that the ultrasonic atomization process described above produces a distribution of droplets with diameters of approximately 0.5 to 10 microns.

The mean droplet diameter of an ultrasonic distribution is related to the liquid surface tension and viscosity and the frequency of the ultrasonic vibration according to equation 1, $$D = 0.34\left(\frac{8\pi\gamma}{\rho f^2}\right)^{\frac{1}{3}} \qquad 1$$

where γ is the surface tension, ρ is the density, and f the excitation frequency. Substituting for the liquid properties and a drive frequency of 1.6 MHz yields a mean droplet diameter of approximately 2.6 microns. The aerodynamic lens system of the invention therefore provides at least one aerodynamic lens to focus droplets with diameters of approximately 2.5 microns. Droplet diameters that fall outside the region of approximately 2.5±2 microns are focused by the sheath gas as the aerosol stream passes through a second lens, or through a series of lenses and an exit nozzle.

Pulsed Aerosol Generation

With reference to FIG. 1, one embodiment of the present invention uses a pulsed power source 9 to drive a piezoelectric transducer 13 of an ultrasonic atomizer unit 1. The power circuit provides excitation of the transducer at variable frequencies in the range of approximately 1 to 2 MHz. Pulsed operation of the atomizer provides generation of a dense, saturated aerosol suspension within the atomizer. The pulsed operation allows for stable aerosol delivery to the flow cell, and reduces or eliminates the production of large droplets that can be entrained in the flow channels of the atomizer or flow cell.

DESCRIPTION OF THE PRIOR ART

Aerodynamic Focusing using a Sheath Gas

Aerodynamic focusing using a sheath gas is generally accomplished by propagating an annular sheath/aerosol flow through a continuously converging nozzle, using differing sheath and aerosol gas flow rates. The degree of focusing is proportional to the ratio of the gas flows. In U.S. Pat. No. 7,108,894B2, Renn discloses a method of aerodynamic focusing using a coaxial sheath gas flow that surrounds an aerosol-laden carrier gas. The combined flow is then propagated through a converging nozzle. Renn teaches that for the operational range of a flow system using a sheathed aerosol stream and a single converging nozzle, the diameter of the focused beam is a strong function of the ratio of the sheath to aerosol gas flow rates.

Particle Collimation in a Gas Flow

Hochberg (1977) has described an apparatus for deposition of a collimated stream of aerosolized particles. The velocity of the aerosol carrier gas flow through a rectangular channel is chosen so that the particles are forced towards the center of the gas flow. A sheath flow upstream of an exit nozzle prevents impaction of particles onto the nozzle.

Aerodynamic Focusing using an Aerodynamic Lens System

Focusing of a stream of aerosol particles using a system of aerodynamic lenses was first reported by Lui in 1995. The system of Lui was used to narrow and collimate a beam of spherical particles with diameters of approximately 25 to 250 nanometers. Lui used a lens system having three to five stages, with emphasis placed on achieving a low pressure drop across each lens. Numerous experimental and theoretical studies have been performed subsequent to the work of Lui, considering the aerodynamic effects of single and multi-orifice lens configurations.

Multi-Stage Lens System

Many researchers have reported studies of aerodynamic focusing of aerosol streams using fixed multi-stage lens systems (Lee, Brockmann, and Lui). Lee discloses an aerodynamic lens for focusing nanoparticles with diameters ranging from 30 to 3000 nanometers. Brockmann describes a multi-stage lens system that focuses large, solid particles. The Brockmann apparatus also uses an annularly flowing sheath gas to prevent impaction of particles onto the orifice surfaces. The apparatus of Brockmann propagates a sheath gas flow through the entire multi-stage lens system. Lui has disclosed an apparatus for focusing nanoparticles using an aerodynamic system consisting of three to five stages.

The preferred embodiment of the present invention uses a tunable atomizer, an interchangeable and adjustable single-stage or multi-stage aerodynamic lens assembly, and an annularly flowing sheath gas to collimate and deposit a stream of particles with diameters in the range of approximately 0.5 to 5 microns.

SUMMARY OF THE INVENTION

A Brief Description of the Drawings

FIG. 1. The preferred embodiment of the apparatus of the invention.

FIG. 2. A summary of various aerodynamic focusing configurations.

Figure 3:
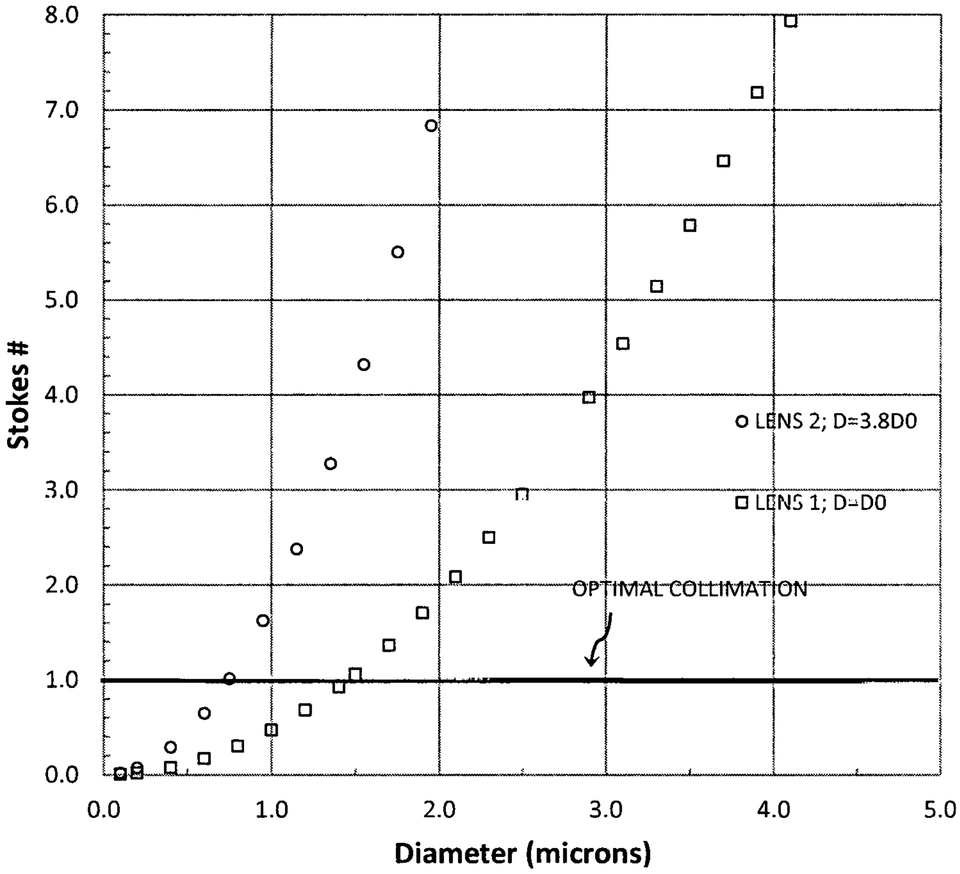

FIG. 3. Plot of the Stokes number as a function of particle diameter for particles passing through the converging nozzle.

Figure 4:
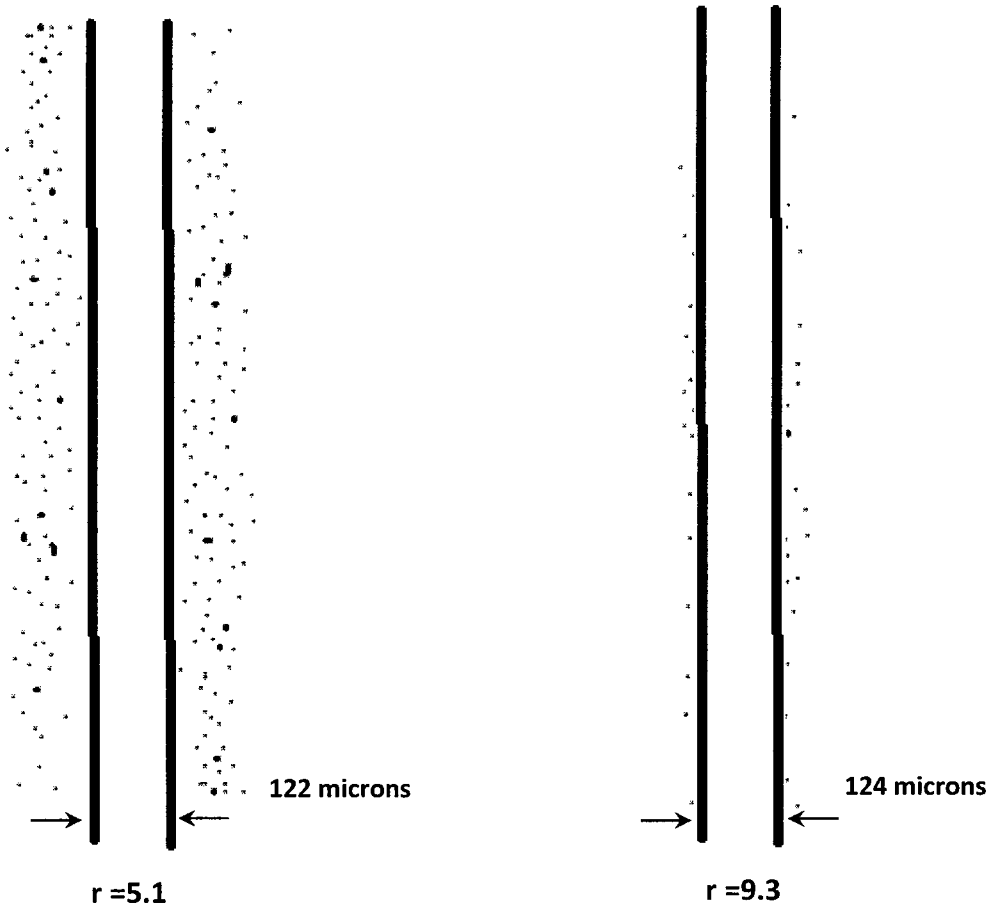

FIG. 4. Schematic representation of traces deposited using the apparatus of the invention with varying sheath flow rates.

Figure 5:
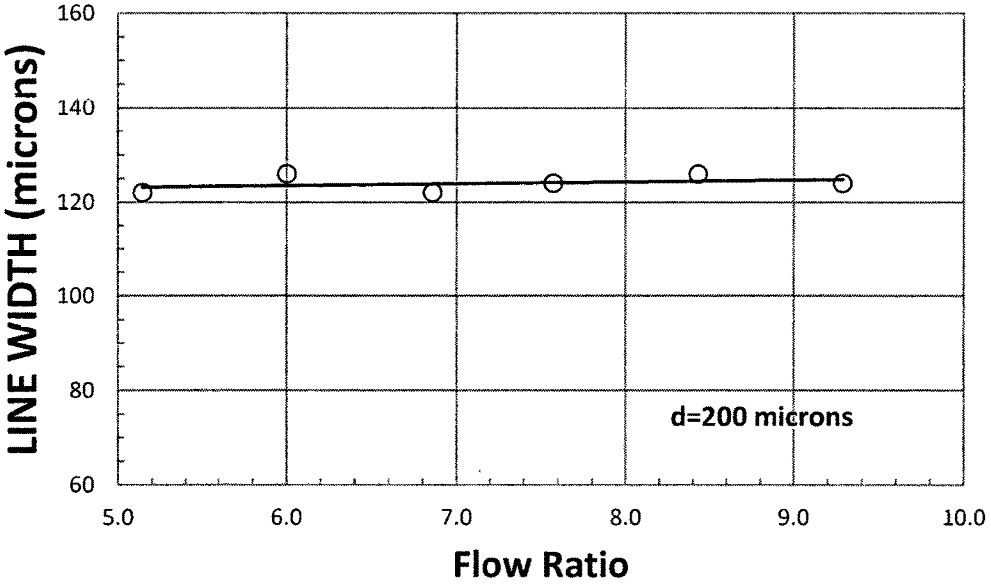

FIG. 5. Plot of deposited line width as a function of the flow ratio for an average width of 124 microns and a standard deviation of 1.8 microns.

Figure 6:
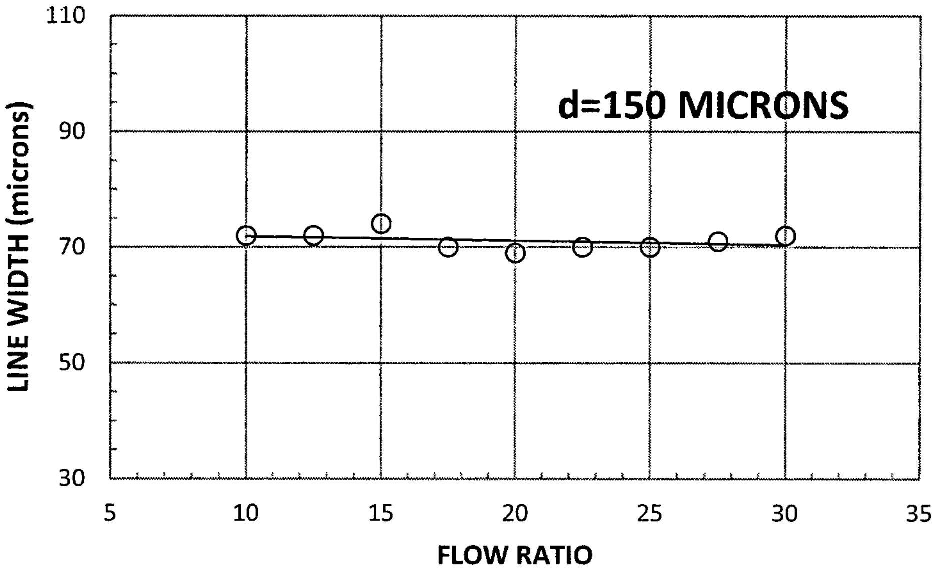

FIG. 6. Plot of deposited line width as a function of the flow ratio for an average width of 71 microns and a standard deviation of 1.5 microns.

Figure 7:
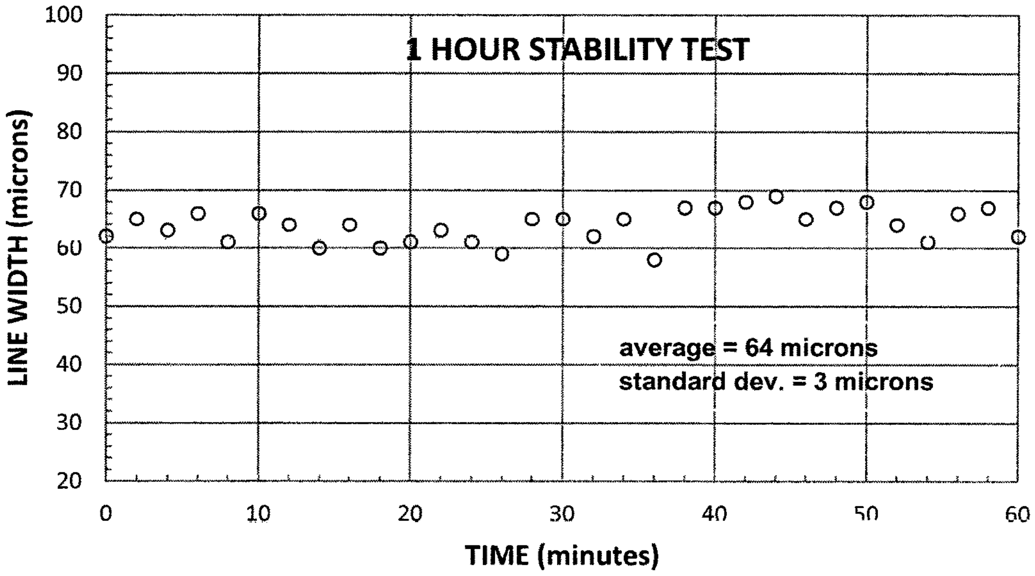

FIG. 7. Plot of line width as a function of time for one hour of continuous operation.

Figure 8:
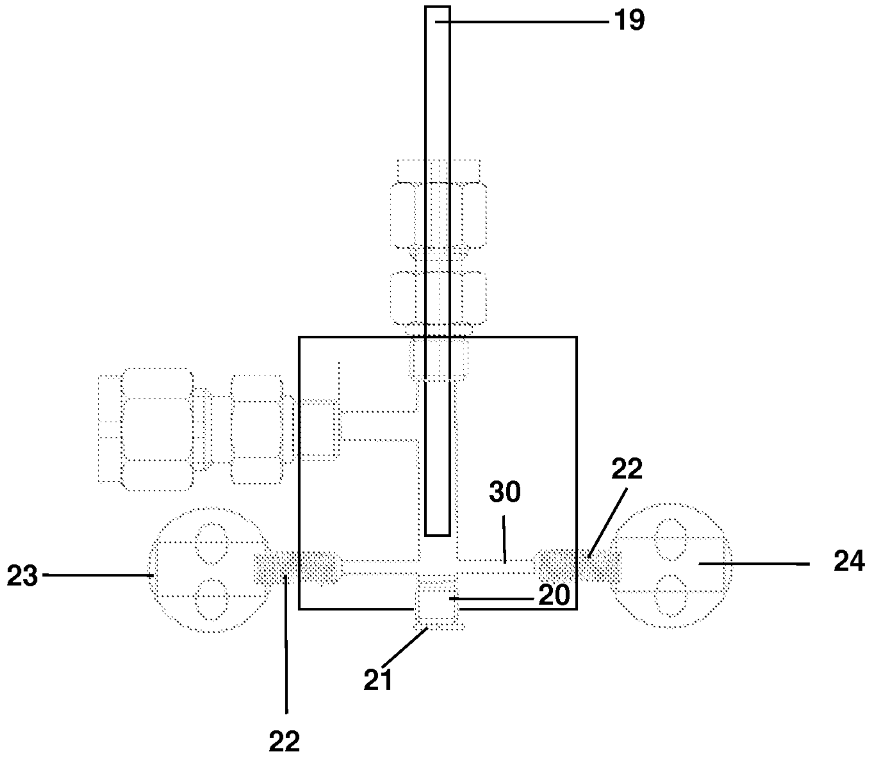

FIG. 8. Aerosol dispense flow cell with dual-valve pneumatic shutter.

Figure 9:
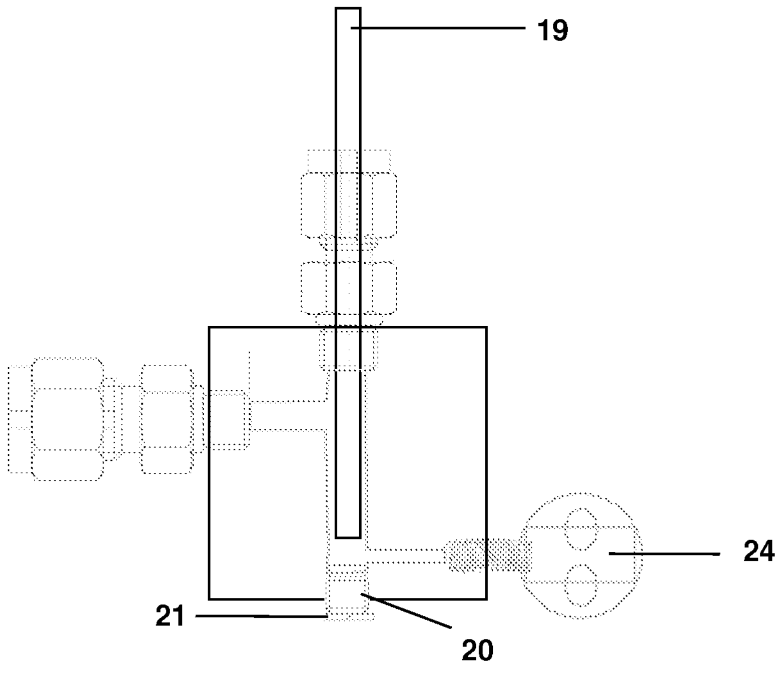

FIG. 9. Aerosol dispense flow cell with sheath/aerosol vacuum shutter.

Figure 10:
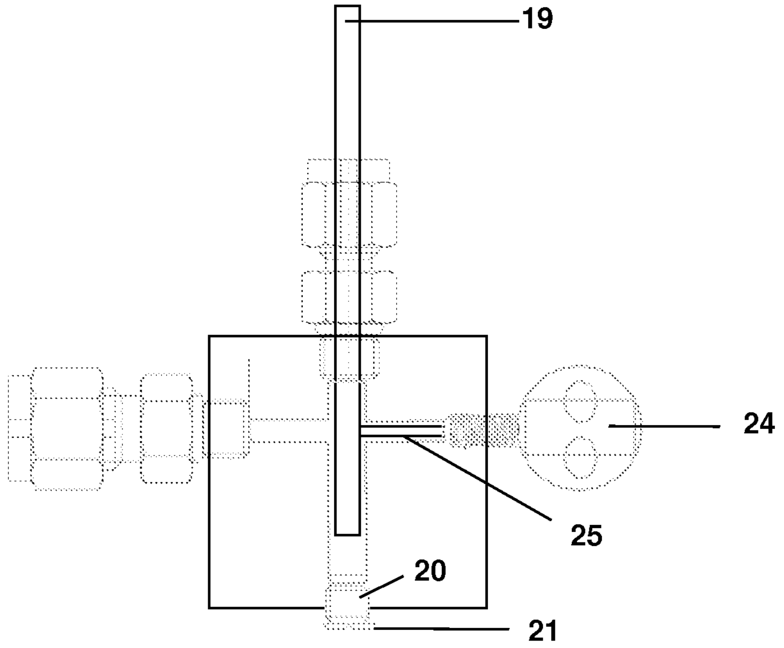

FIG. 10. Aerosol dispense flow cell with aerosol vacuum shutter.

A DETAILED DESCRIPTION OF THE PREFERRED EMBODIMENTS

Introduction

The invention provides for a method and apparatus for direct printing of microscopic to macroscopic features on a substrate in ambient conditions. Of particular interest is the provision of a process and apparatus for stable and repeatable deposition of liquids onto substrates for additive manufacturing applications, including but not limited to metallization of rigid and flexible substrates, deposition of inorganic and organic samples for sensor applications, and deposition of various inks for green energy applications such as solar cell metallization and fuel cell production.

General Description of the Device

The preferred embodiment of the device is shown in FIG. 1. The device consists of an atomizer 1, a flow cell 2, and a process control system, not shown. The atomizer may produce a mono-dispersed droplet distribution or a more common poly-dispersed distribution of droplet diameters over a range of several microns. One object of the invention is the provision of apparatuses and methods for focusing aerosol streams with a droplet diameter distribution of several microns. The apparatus of the invention uses a low-power ultrasonic atomizer to produce a narrow distribution of droplet diameters tuned to an aerodynamic lens system. In the preferred embodiment of the invention, the ultrasonic atomizer consists of a planar piezoelectric transducer 13 in direct contact with the liquid sample. An indirect sample/transducer contact method may also be used to produce an aerosol distribution. The atomizer power supply 9 provides a continuous or pulsed excitation at the transducer resonant frequency. The main components of the power supply are a dc power supply 10, a computer interface 12, and an atomizer drive circuit 11. A carrier gas enters the atomizer through input port 6. A baffle 8 and an angled aerosol exit channel 7 prevent entrainment of fluid and large droplets in the aerosol output port 5 and the aerosol delivery line. The flow cell 2 consists of a flow chamber housing and an aerodynamic lens system that incorporates a sheath gas flow. Reduction of the diameter of an aerosol beam introduced into the flow cell via the carrier gas input port 18 is accomplished through the combined effect of the sheath gas and the lens system. The aerosol-laden carrier gas stream is narrowed by passing through at least two sets of contractions and subsequent expansions along the flow cell axis. The lens system is tuned to the mean diameter of the aerosol distribution, so that a particle stream with a diameter that is a fraction of the exit orifice diameter is formed when the stream passes through the exit orifice. The converging nozzle 4 is typically a fluid dispense tip, with an exit orifice diameter ranging from 50 to 500 microns. The sheath gas flow is primarily used to prevent impaction of the droplets onto the surfaces of the lens and to focus small particles as the stream is passed through the converging nozzle. Brockmann reports collimation of a metal particle stream using an orifice as the final aerodynamic lens. Consequently, another embodiment of the present invention may be comprised of a lens system formed by a series of orifices with no converging exit nozzle. In such a configuration, the final lens serves as the exit orifice.

Aerodynamic Lens Stages

The parameters of the present invention are adjusted to match the distribution of an aerosol source and the working range of the aerodynamic lens. In the preferred embodiment of the invention, the sheath gas flow is combined with the output an aerosol conduit, and the combined annular flow is directed through an aerodynamic lens assembly. A stage is defined as an aerodynamic lens configuration that produces one contraction and expansion of the gas stream. The invention uses at least two stages to collimate and focus the aerosol stream. The combined flows are directed through an exit orifice. The parameters of the aerosol source can also be adjusted to approximately match the peak of the aerosol distribution to the functional range of the first aerodynamic lens. The Reynolds number of the sheath flow through the exit orifice is adjusted so that the smaller droplets in the aerosol distribution are collimated by the sheath gas, producing a narrow, collimated beam. The aerosol beam remains collimated up to approximately one centimeter beyond an exit orifice, and produces high-resolution traces with little or no extraneous deposition in the form of droplets deposited beyond the borders of the trace. Deposited trace line widths are in the range of approximately 10 to 1000 microns.

Apparatus and Process Parameters

In the preferred embodiment of the invention, the output of the atomizer is matched to the functional range of the aerodynamic lens system. The atomizer output is typically poly-dispersed, consisting of a distribution of droplet diameters in the range of approximately 0.5 to 5 microns.

In general embodiment of the invention, an aerodynamic lens is defined as a flow device that produces at least one contraction and expansion of a gas stream before entering an exit nozzle.

An aerodynamic lens is formed from a channel with a distinct and abrupt reduction in cross sectional area formed by an orifice generally located at the downstream end of the channel. The functional range of the aerodynamic lens system depends on the aerodynamic and device parameters, such as channel length and width, orifice diameter, and the number of lenses. The apparatus of the invention is typically tuned so that the mean size in the droplet distribution of the atomizer is narrowed and collimated by the lens system. Droplets with diameters approximately one to two microns plus or minus the mean diameter are also focused by the lens system. An annularly flowing sheath gas is used to force small droplets in the distribution into a diameter that is less than or approximately equal to the diameter into which larger droplets are collimated. In the general embodiment, the sheath flow is used to narrow the small droplet trajectories and to collimate droplets in the lower end of the distribution, while the lens system is used to collimate larger droplets with diameters near the mean diameter of the distribution.

The preferred embodiment of the invention is designed to focus a droplet distribution centered about a diameter of approximately 1.5 to 2.5 microns, as calculated by equation 1.

Focusing of an aerosol stream by an orifice is dependent on the particle Stokes number, S. De la Mora teaches that in a cylindrically symmetric configuration, particles will cross the flow axis at a common focal point if S if greater than a critical value S*. It has been shown that a threshold value for focusing is obtained when S*~1. De la Mora also teaches that the focused spot diameter may be as much as 100 times smaller than the orifice diameter if the region over which particles are seeded is restricted. Restriction of the particle trajectories entering the orifice is accomplished in the present invention by using an aerodynamic lens upstream of the exit nozzle.

The Stokes number is related to the particle diameter and the orifice diameter according to the equation;

$$St = \left(\frac{\rho d^2 C}{18\mu}\right)\frac{U}{D} \qquad 2$$

where ρ is the particle density, d the particle diameter, C the slip correction factor, μ the gas dynamic viscosity, U the gas velocity at the orifice, and D the orifice diameter. The slip correction factor is calculated to be approximately 1. A plot of St versus particle diameter for the parameters of a common configuration of the invention is shown in FIG. 3. The plot shows the approximate Stokes number for a distribution of particles passing through an aerodynamic lens system under the influence of a sheath gas flow. The lens system is comprised of two orifices with diameters $D_0$ and $3.8D_0$. As the combined aerosol/sheath flow propagates through lens 1, large particles (particles with diameter from approximately 1.5 to 3 microns) are forced towards the center of the aerosol stream, while smaller particles are strongly coupled to the sheath gas flow. As the sheathed flow propagates through lens 2, particles with diameters of approximately 0.7 to 1.5 microns are forced towards the center of the flow by the sheath gas. Particles with diameters greater than approximately 1.5 microns are largely unaffected by lens 2. The plot of FIG. 3 shows that a Stokes number of one is obtained at a particle diameter of approximately 0.75 microns as the combined flow passes through the final orifice. The sheath flow through the exit orifice will therefore focus small particles in the aerosol distribution, but have little or no effect on medium to large particles in the distribution collimated by the aerodynamic lens or lenses upstream of the exit orifice. FIG. 3 also shows that St increases rapidly with increasing particle diameter, so that particles with diameter greater than approximately 5 microns are decoupled from the central flow.

The focusing characteristics of the aerodynamic lens system of the invention have been observed experimentally, and are presented in FIG. 4. The flow through all configurations of the apparatus of the invention is subsonic. The schematic of FIG. 4 represents deposited silver nanoparticle ink traces for flow ratios (sheath flow rate/aerosol flow rate) of 5.1 and 9.3. At a flow ratio of 5.1, small and large particles, with diameters on either side of the aerosol distribution are deposited outside the boundary of the deposited trace. However at a flow ratio of 9.3, extraneous droplet deposition outside the boundary of the deposited trace is nearly eliminated, while the line width of the trace remains constant. The aerodynamic lens system of the invention is therefore used to produce high-quality printed features by focusing a distribution of particle sizes using multiple orifices.

Mono-Dispersed Aerosol

In one embodiment of the invention a mono-dispersed aerosol stream is injected into the flow cell. A sheath gas flow is then added to the aerosol stream such that an annular distribution is achieved, with the aerosol droplets in the core of the combined stream, and the sheath gas forming an annular flow around the core flow. The configuration is similar to that disclosed by Brockmann; however the preferred embodiment of the present invention uses a single aerodynamic lens system tuned to the droplet diameter of the atomization source, so that a highly-collimated aerosol stream is produced. The aerosol stream flows through a converging nozzle and is deposited on a stationary or mobile substrate, so that high-definition structures are produced.

Poly-Dispersed Aerosol

The general embodiment of the invention is comprised of an atomizer, and atomizer temperature controller, a pressure source that delivers gas flow through one or more mass flow controllers or through a flow orifice, a flow cell, and a motion control system. In the preferred embodiment, poly-dispersed aerosol droplets of a specific size distribution are produced using an ultrasonic atomizer. Numerous studies characterizing the production of aerosols using ultrasonic energy have been reported. Ultrasonic atomizers typically produce a distribution of droplet sizes, with the mean droplet diameter related to the excitation frequency, the liquid surface tension, and the liquid density by equation 1. Lozano has reported that the droplet distribution produced in the ultrasonic atomization process is also a function of the drive voltage. Lozano has measured the droplet diameter distribution for water using an excitation frequency of 1.67 MHz, and drive voltages from 12.5 to 47.5 voltages. Lozano measured pronounced peaks at 3.5 and 5.5 microns. At drive voltages above approximately 20 volts, a third peak appears in the distribution at approximately 1 micron. Contrastingly, a drive voltage of 12.5 volts shows a pronounced peak at approximately 5 microns. The measurements of Lozano are in agreement with experimental observations of the inventor with respect to production of an aerosol stream that can be brought to a sharp focus by an aerodynamic lens system followed by a converging nozzle. An object of the invention therefore is to provide an aerodynamic system to narrow and collimate aerosol droplets with a size distribution in the range of approximately 0.5 to 5 microns in diameter. In one embodiment, the apparatus consists of a single-stage aerodynamic lens designed to narrow and collimate droplet diameters of approximately 2 to 5 microns. An annular sheath gas is also propagated through the flow cell to minimize or prevent impaction of large droplets onto the lens surfaces. The sheath flow also serves to force small droplets in the lower end of the aerosol distribution towards the center of the flow. (FIG. 3) In a general embodiment of the invention, the sheath gas flow rate is adjusted to force droplets with diameters of approximately one micron or less towards the flow axis. The apparatus lens parameters and the sheath flow rate are adjusted so that the sheath flow focuses small droplets (diameters of approximately one micron or less) to a diameter that is less than or approximately equal to the diameter of the aerosol stream formed by the larger droplets in the aerosol distribution. A schematic representation of two traces deposited from an aerosolized silver nanoparticle ink using the apparatus of the invention is shown in FIG. 4. The flow ratio is defined as the ratio of the sheath flow rate to the aerosol carrier gas flow rate. Traces were printed on glass substrates to measure the effect of flow ratio on deposited line width. A plot of line width versus flow ratio is shown in FIG. 5 and FIG. 6. The plot of FIG. 5 was obtained for flow through an exit nozzle with an orifice diameter of 200 microns. The average line width is 124 microns, with a standard deviation of 1.8 microns, for flow ratios ranging from 5.1 to 9.3. FIG. 6 shows the effect of sheath flow on the deposited line width for flow through a 150 micron exit nozzle. The flow ratio was varied from 10 to 30. The average line width is 72 microns, with a standard deviation of 1.5 microns. Both cases show that the deposited line width is independent of the sheath gas flow.

In another embodiment of the invention, a second stage is used to collimate the smaller droplets in the distribution, and is located downstream of first stage. The second lens is used to collimate droplets with diameters of approximately 1 micron; however the lens function can be tuned using adjustable lens parameters and interchangeable lenses, so that streams with particle diameters as small as approximately 0.2 microns are narrowed.

Atomizer Design

The design and function of the liquid atomizer is critical to the production of a stable deposition process. The present invention places particular emphasis on production of a droplet distribution with a mean diameter centered on the operational range of the aerodynamic lens/nozzle system. The invention also provides a mechanism for preventing fluid entrainment in the aerosol delivery line.

Ultrasonic atomization techniques that use a planar piezo-electric crystal to induce vibrations in a fluid surface produce a distribution of micron-size aerosolized droplets as well as a macroscopic fluid spout that rises several centimeters above the fluid surface. A schematic of the atomizer is shown in FIG. 1. A means to prevent entrainment of fluid from the spout into the delivery line should be provided to eliminate clogging of the flow cell. One embodiment of the present invention provides an apparatus for the production of a stable, narrow aerosol distribution without entrainment of bulk fluid or large droplets by using a low-power transducer in direct contact with a liquid sample, and an internal configuration that traps bulk liquid and large droplets produced by the spout. Experimental studies have shown that the droplet distribution produced by an ultrasonic atomizer is dependent on the excitation frequency and the power applied to the transducer. A power of approximately eight watts and at a frequency of 1.6 MHz has been shown to produce a droplet distribution that is focusable by the lens configurations of the invention. A baffle 8 and an angled aerosol exit port 7 prevent entrainment of fluid and large droplets in the delivery line.

Aerosol Generation and System Tuning

The atomizer of the invention provides for a variable aerosol distribution that can be tuned to match the operational range of the aerodynamic lens system of the flow cell. The generation of aerosol is pulsed or continuous, using a variable frequency to drive an interchangeable piezoelectric transducer. After the mean diameter of the droplet distribution is chosen to match the range of the aerodynamic lens, the sheath flow rate is adjusted to focus large and small droplets on either side of the distribution curve.

System Stability

Another provision of the present invention is that of a stable platform for deposition of high-definition traces, with minimum variation of physical or electrical properties for extended periods. Variation of the aerosol mass flux to a substrate has been minimized or eliminated using temperature control and optimized aerosol transport methods. Specifically, the atomizer and the atomizer drive circuit components are held to a constant temperature, so that aerosol production is constant. Also, the aerosol delivery channel leading from the atomizer is slanted at an angle of at least approximately 25°, and shielded from large aerosol droplets by a baffle, FIG. 1. The angled exit channel 7 and baffle 8 prevent fluid entrainment into the flow cell aerosol channel and into the lens assembly.

Traces are generally deposited at speeds ranging from 5 to 50 mm/s, so that short-term variations in deposition rate—on the order of seconds—appear as variations in trace line width. The absence of short-term variations in the ink mass flux is evident from the edge definition of deposited traces; The absence of long-term variations in the ink mass flux is evident from stability studies, wherein the deposited line width is measured as a function of time for as much eight hours. A one-hour stability test wherein traces were printed at two-minute intervals yields an average line width of 64 microns, with a standard deviation of 3 microns. A plot of line width as a function of time is shown in FIG. 7. The tolerance, defined as the ratio of the standard deviation in line width to the average line width, is 4.7%. The present invention is capable of printing features with a tolerance of less than 5% over a period of a minimum of eight hours.

Shuttering

The present invention provides for shuttering of the aerosol stream. Interruption of flow of the aerosol stream to the substrate must be accomplished for maskless printing of discreet structures. In one embodiment, a mechanical shutter consisting of a hollow tube mounted to an electromechanical actuator connected to a collection chamber is used to shutter the stream. In another embodiment shown in FIG. 8, shuttering is accomplished by diverting the combined aerosol/sheath flow to a collection chamber using a combined vacuum and pressure-based actuation. The aerosol enters the flow cell via conduit 19. Particle collimation and focusing is provided by aerodynamic lenses 20 and 21. Hollow set screws 22 connect electromechanical valves to the pressure and vacuum sources. The electromechanical valves 23 and 24 are in communication with a pressure source and vacuum source respectively. In the shuttering action, a pressurized flow pushes the combined flows along a horizontal channel 30. In the same action, a partial vacuum pulls flow along the channel 30 and from the main vertical flow channel. Shuttering is also accomplished by diverting the combined sheath and aerosol flows using a single electromechanical valve in communication with a vacuum source, FIG. 9. In yet another pneumatic shutter design shown in FIG. 10, an electromechanical valve in communication with a vacuum source is placed in communication with the aerosol delivery conduit 19, so that shuttering of the aerosol flow is achieved without interruption of the sheath flow.

Multi-Nozzle Microjet Arrays

The general design of invention is applicable to the manufacture of multi-nozzle arrays. In a multi-nozzle configuration, an assembly consisting of several exit nozzles with sheathed flows is fabricated—usually in a linear array—so that simultaneous deposition from each nozzle is enabled.

Laser-Assisted Microjet Deposition

In another embodiment the apparatus is configured so that the aerosol stream is intercepted at the substrate by a focused laser beam. The laser distribution provides preferential heating of the sample liquid. The configuration allows for deposition of features with line widths less than 10 microns. The laser-jet configuration allows for controlled heating and evaporation of the deposited liquid while minimizing heating of a transparent or nearly transparent, or opaque substrate. In some cases uncontrolled spreading of the jetted liquid will occur as the liquid strikes the substrate. Increasing the viscosity of the liquid just above the deposition zone changes the fluid dynamics so that uncontrolled spreading and even splashing is eliminated. Laser heating of the liquid just before or just after impact onto the substrate increases the viscosity of the liquid. The increased viscosity allows for deposition of structures with increased line height, and also enables printing of three-dimensional structures. The line height is then dependent on the incident laser power, the liquid deposition rate, and the substrate speed.

Direct Printing of UV Curable Inks

In one embodiment of Laser-Assisted Liquid Jet Deposition, the inner liquid is a UV curable ink. Focused or unfocused UV or visible laser radiation is directed onto the jet so that in-flight curing of the ink (core liquid) is accomplished. The laser radiation may also be focused onto the substrate deposition zone to promote real time curing of the deposited ink. A subsequent substrate heating step removes any residual sheath liquid from the substrate surface.

Direct Printing of Films and Discreet Structures

The device is capable of printing continuous lines on a substrate. If the substrate is placed some distance beneath the aerosol stream such that the distance is above the point of initiation of Rayleigh instabilities, a continuous line is written as the substrate is moved. The width of the line depends on the device parameters, the fluid parameters, and the substrate speed. The device is capable of operating at print speeds of approximately 1 to 5000 mm/sec.

3D Printing

The present invention can also be used to build three-dimensional structures using a layer-wise process, wherein simple and complex objects are printed directly from a computer-automated drawing (CAD) file. In the 3D printing process, laser-assisted deposition or a viscoelastic ink is used to deposit a liquid filament with a viscosity sufficient to form a rigid or semi-rigid structure upon which subsequent layers are deposited. In the 3D printing technique, a digital model of an object is intersected with horizontal planes. The horizontal planes form cross sectional representations or slices of the object. Information in each slice is uploaded to a computerized motion control system, so that a solid object can be fabricated using an additive manufacturing process. The process can be used to fabricate three-dimensional objects from materials including, but not limited to metals, ceramics, and plastics.

3-D Structures for Medical Applications

In yet another embodiment the apparatus of the invention could be used to produce structures for medical applications.

The flow cell technology could be used to produce scaffolding for tissue engineering applications. The same flow cell could also be used to print living cells and nutrients for those cells in tissue engineering applications.

The invention claimed is:

1. An apparatus for direct printing of features on a surface using an aerodynamically focused aerosol stream, the apparatus comprising;

a low-power ultrasonic atomizer with variable, continuous or pulsed excitation in direct or indirect contact with a liquid sample;

an atomizer temperature controller;

a flow cell comprised of an aerodynamic lens system to create a combined aerosol and sheath flow comprising at least two aerodynamic lenses and a sheath gas flow that flows through the aerodynamic lens system;

a first lens having an operational range matched to the mean diameter of the atomizer aerosol distribution for the purpose of collimating medium-size particles, while the sheath flow and exit orifice are matched to the large and small particles in the distribution for the purpose of focusing particles at either end of said size distribution.

2. The apparatus of claim 1 wherein the final lens is a converging fluid dispense nozzle.

3. The apparatus of claim 1 wherein a valve in communication with a vacuum source is used to interrupt the aerosol flow to a substrate so that discreet features are printed on the substrate.

4. The apparatus of claim 1 wherein a valve in communication with a vacuum source is used to interrupt the combined sheath and aerosol flows to a substrate so that discreet features are printed on the substrate.

5. The apparatus of claim 1 wherein the combination of a valve in communication with a vacuum source and a valve in communication with a pressure source is used to interrupt the combined aerosol and sheath flows to the substrate.

* * * * *